DEFENSIVE PUBLICATION

UNITED STATES PATENT OFFICE

Published at the request of the applicant or owner in accordance with the Notice of Dec. 16, 1969, 869 O.G. 687. The abstracts of Defensive Publication applications are identified by distinctly numbered series and are arranged chronologically. The heading of each abstract indicates the number of pages of specification, including claims and sheets of drawings contained in the application as originally filed. The files of these applications are available to the public for inspection and reproduction may be purchased for 30 cents a sheet.

Defensive Publication applications have not been examined as to the merits of alleged invention. The Patent Office makes no assertion as to the novelty of the disclosed subject matter.

PUBLISHED JULY 2, 1974

924 O.G. 6

T924,002

METHOD OF DECODING A VARIABLE LENGTH PREFIX FREE COMPACTION CODE

Louis S. Loh, Mohegan Lake, Jacques H. Mommens, Briarcliff Manor, and Josef Ravi, Ossining, N.Y., assignors to International Business Machines Corporation, Armonk, N.Y.

Continuation of application Ser. No. 119,275, Feb. 26, 1971. This application June 8, 1973, Ser. No. 368,375

**Int. Cl. G06f *7/06***

U.S. Cl. 340—172.5

6 Sheets Drawing. 33 Pages Specification

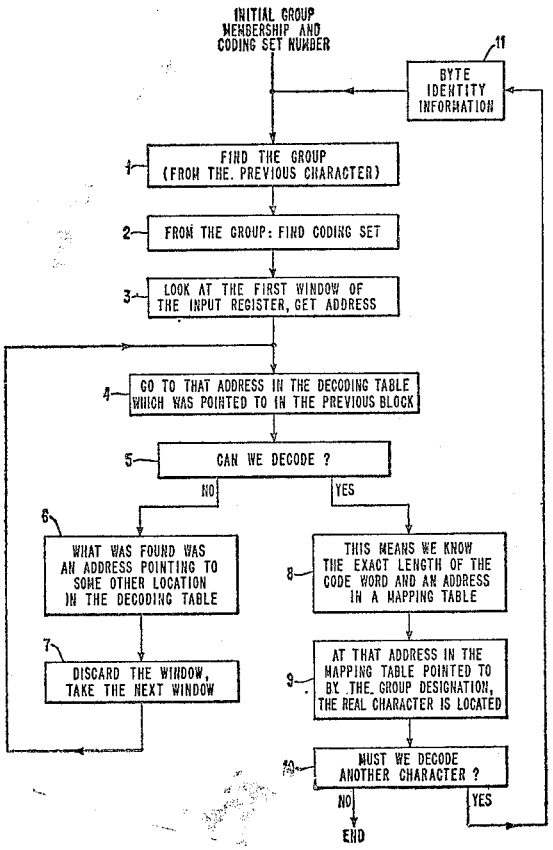

Figure 1:
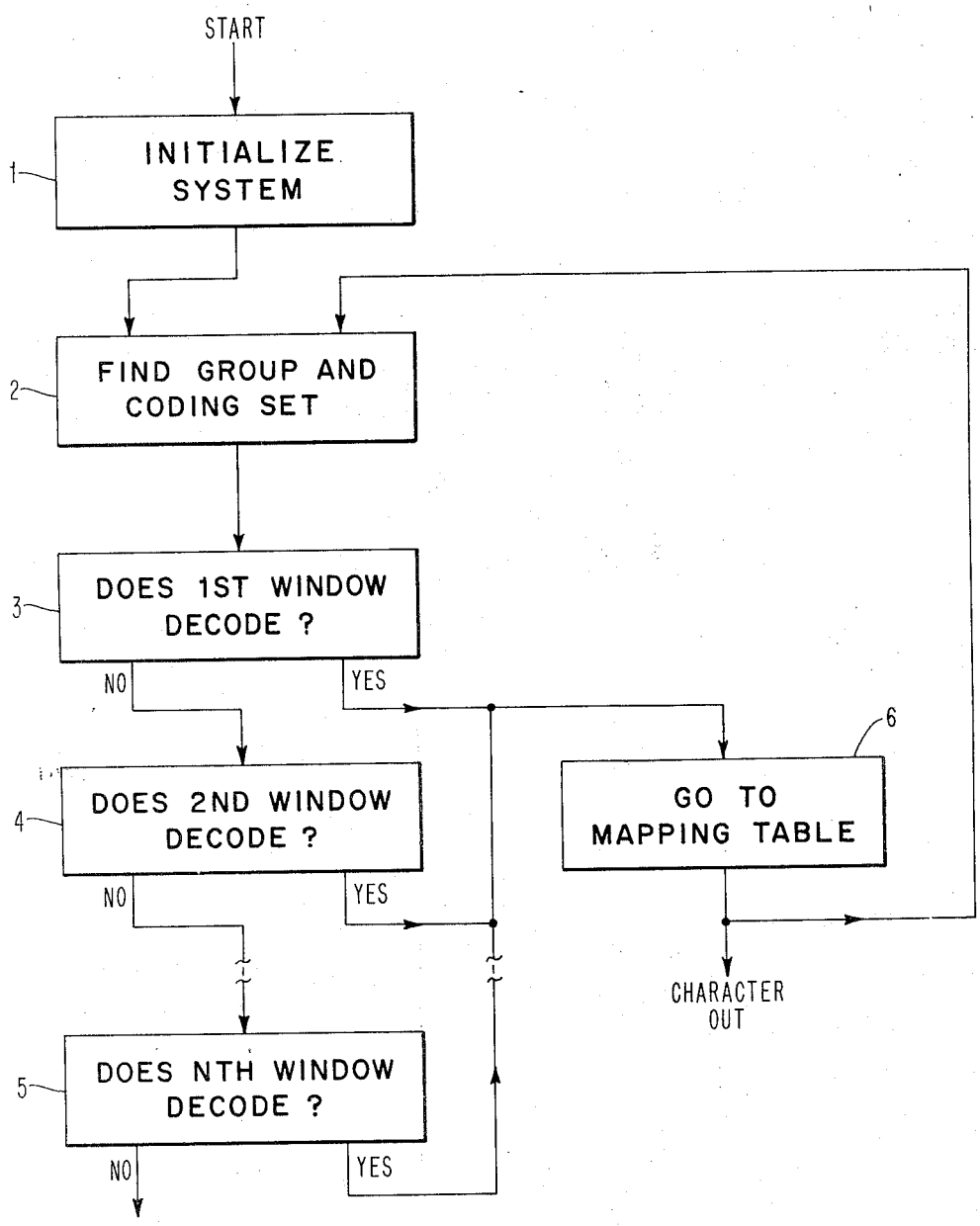
Figure 2:
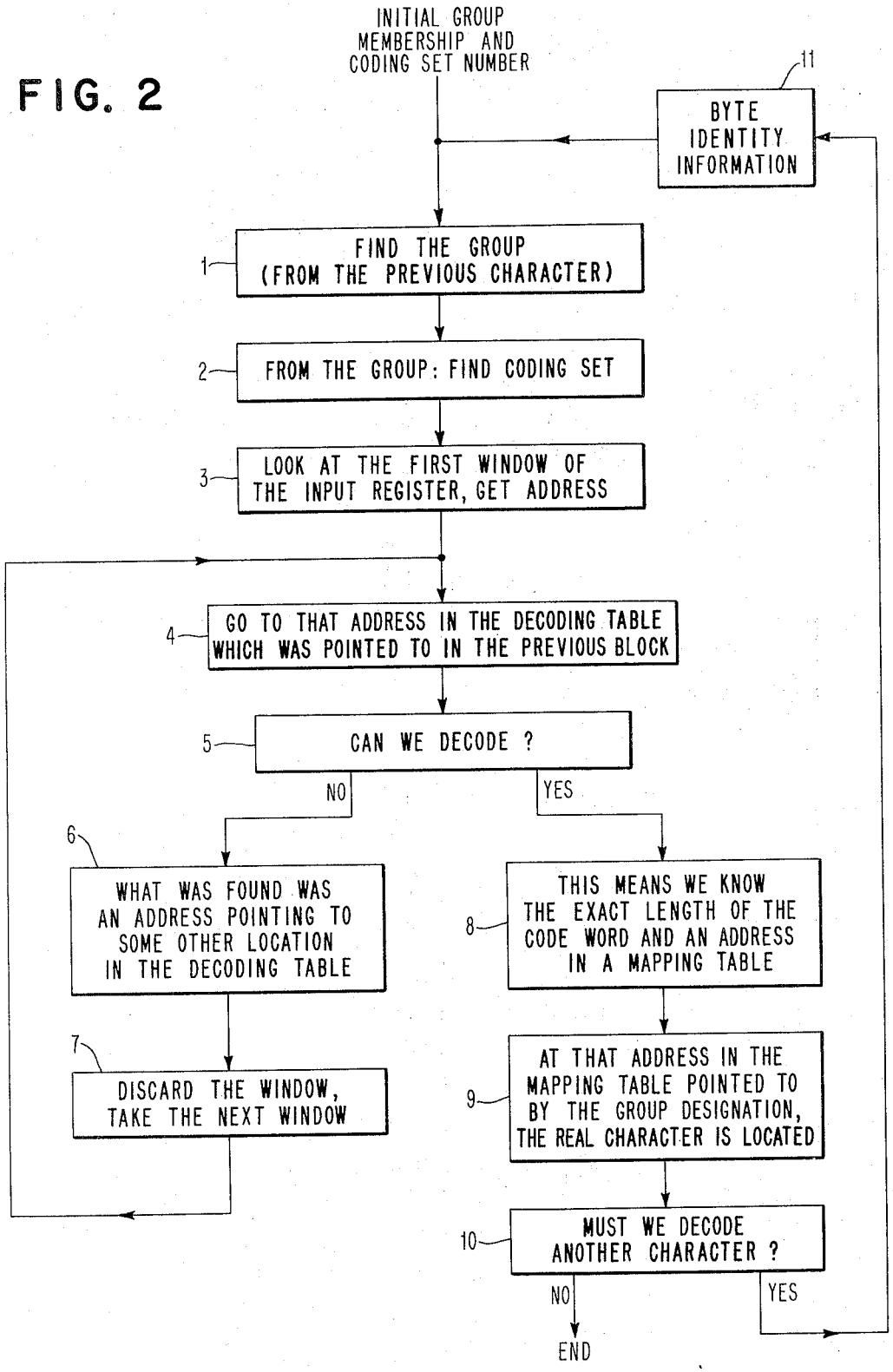
Figure 3:
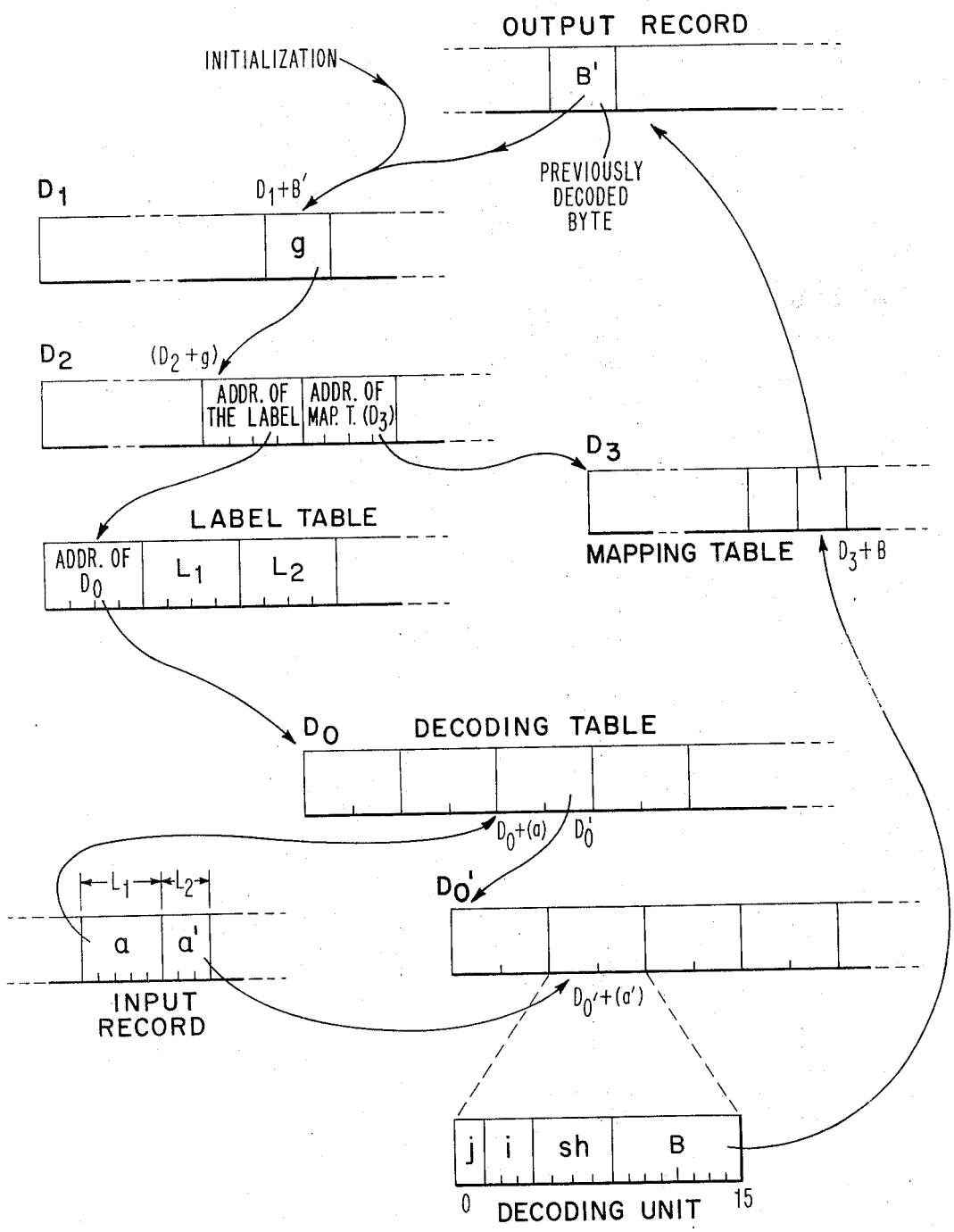
Figures 7, 8:
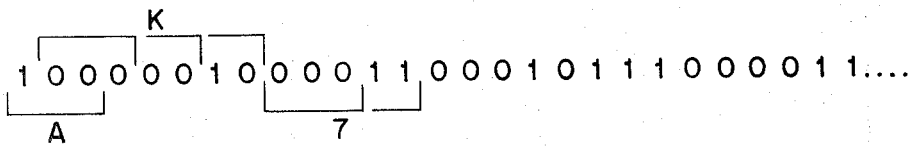

A method for decoding variable length prefix free code words into fixed length code words using a general purpose electronic computer. The method as shown in FIG. 2 comprises placing the decoding table for a variable length code designation of each character of said decoding table is located at an address which is directly derivable from the variable length coded data. The method further comprises the steps of analyzing a continuous stream of binary digits being fed into the decoder program utilizing variable length windows wherein the next window is used if a former window fails to contain enough information to produce a successful decoding operation. The method may equally well be used with variable length codes wherein the code length is based on the independent probability of occurrence of a particular character or for a dependent variable length code wherein the code assignment is based on the probability of occurrence of a particular character after some one or more preceding characters. U.S. Pat. No. 3,694,813, issued Sept. 26, 1972, of the present applicants, entitled "Method of Achieving Data Compaction Utilizing Variable Length Dependent Coding" discloses a suitable method for deriving the code per se and thus the code assignment tables and the state, group and coding set membership and mapping tables which keep track of the reordering operations which must of necessity take place with a dependent coding schedule.

INVENTORS
LOUIS S. LOH
JACQUES H. MOMMENS
JOSEF RAVIV
BY
ATTORNEY

FIG. 4

TYPICAL ASSIGNMENT TABLE

| CODING SET INDICATORS | VARIABLE LENGTH CODE WORD | CODE LENGTH |
|---|---|---|
| 1 | 1 | 1 |
| 2 | 0 1 0 | 3 |
| 3 | 0 1 1 | 3 |
| 4 | 0 0 1 1 | 4 |
| 5 | 0 0 1 0 0 | 5 |
| 6 | 0 0 1 0 1 | 5 |
| 7 | 0 0 0 1 1 | 5 |
| 8 | 0 0 0 1 0 | 5 |
| 9 | 0 0 0 0 0 0 1 | 7 |
| 10 | 0 0 0 0 0 1 0 | 7 |
| 11 | 0 0 0 0 0 1 1 | 7 |
| 12 | 0 0 0 0 1 0 | 6 |
| 13 | 0 0 0 0 1 1 | 6 |
| 14 | 0 0 0 0 0 0 0 1 | 8 |
| 15 | 0 0 0 0 0 0 0 0 0 | 9 |
| 16 | 0 0 0 0 0 0 0 0 1 | 9 |

FIG. 5

MAPPING TABLES

| | | CODING SET DESIGNATIONS | | | | | | | | | | | | | | | |
|---|---|---|---|---|---|---|---|---|---|---|---|---|---|---|---|---|---|
| | | 1 | 2 | 3 | 4 | 5 | 6 | 7 | 8 | 9 | 10 | 11 | 12 | 13 | 14 | 15 | 16 |
| GROUPS | MP1 | A | B | C | X | Y | Z | T | U | G | K | L | 8 | | | | |
| | MP2 | K | L | M | T | R | 8 | 7 | 6 | 5 | 3 | 2 | S | D | A | U | * |
| | MP3 | E | H | I | K | * | 2 | 7 | B | X | A | | | | | | |

FIG. 6A

MEMBERSHIP TABLE $D_1$

| PREVIOUS CHARACTER | * | 1 | 2 | 3 | A | B | C | D | E | F | G | H | I | J | K | L | M | W | X | Y | Z |
|---|---|---|---|---|---|---|---|---|---|---|---|---|---|---|---|---|---|---|---|---|---|
| GROUPS | 1 | 2 | 3 | 3 | 1 | 2 | 2 | 1 | 3 | 1 | 1 | 3 | 3 | 1 | 3 | 2 | 1 | | | | |

FIG. 6B

DECODING TABLE $D_2$

| GROUP NO. | ADDRESS OF LABEL | MAPPING TABLE ADDRESS |
|---|---|---|
| 1 | ADDR. OF L | ADDR. OF MP1 |
| 2 | ADDR. OF L | ADDR. OF MP2 |
| 3 | ADDR. OF L | ADDR. OF MP3 |

FIG. 6C

LABEL TABLE L

| ADDR. OF $D_0$ | $L_1 = 3$ | $L_2 = 2$ | $L_3 = 2$ | $L_4 = 2$ |
|---|---|---|---|---|

DECODING TABLE

| DECODE TABLE RELATIVE ADDR. | FIELDS IN DECODING UNIT | | | | ADDRESSES FROM INPUT REGISTER |
|---|---|---|---|---|---|
| | j | i | sh | B | |
| BASE ADDR. $D_0$ → 0 | 0 | | | 12 | 0 0 0 |
| 1 | 0 | | | 7 | 0 0 1 |
| 2 | 1 | 0 | 3 | 2 | 0 1 0 |
| 3 | 1 | 0 | 3 | 3 | 0 1 1 |
| 4 | 1 | 0 | 1 | 1 | 1 0 0 |
| 5 | 1 | 0 | 1 | 1 | 1 0 1 |
| 6 | 1 | 0 | 1 | 1 | 1 1 0 |
| 7 | 1 | 0 | 1 | 1 | 1 1 1 |
| 8 | 1 | 0 | 5 | 5 | (0 0 1)0 0 |
| 9 | 1 | 0 | 5 | 6 | (0 0 1)0 1 |
| 10 | 1 | 0 | 4 | 4 | (0 0 1)1 0 |
| 11 | 1 | 0 | 4 | 4 | (0 0 1)1 1 |
| 12 | 0 | | | 4 | (0 0 0)0 0 |
| 13 | 0 | | | 11 | (0 0 0)0 1 |
| 14 | 1 | 0 | 5 | 8 | (0 0 0)1 0 |
| 15 | 1 | 0 | 5 | 7 | (0 0 0)1 1 |
| 16 | 0 | | | 4 | (0 0 0 0 0)0 0 |
| 17 | 1 | 0 | 7 | 9 | (0 0 0 0 0)0 1 |
| 18 | 1 | 0 | 7 | 10 | (0 0 0 0 0)1 0 |
| 19 | 1 | 0 | 7 | 11 | (0 0 0 0 0)1 1 |
| 20 | 1 | 0 | 9 | 15 | (0 0 0 0 0 0 0)0 0 |
| 21 | 1 | 0 | 9 | 16 | (0 0 0 0 0 0 0)0 1 |
| 22 | 1 | 0 | 8 | 14 | (0 0 0 0 0 0 0)1 0 |
| 23 | 1 | 0 | 8 | 4 | (0 0 0 0 0 0 0)1 1 |
| 24 | 1 | 0 | 6 | 12 | (0 0 0 0 1)0 0 |
| 25 | 1 | 0 | 6 | 12 | (0 0 0 0 1)0 1 |
| 26 | 1 | 0 | 6 | 13 | (0 0 0 0 1)1 0 |
| 27 | 1 | 0 | 6 | 13 | (0 0 0 0 1)1 1 |